(12) United States Patent
Hsu et al.

(10) Patent No.: US 7,750,715 B2
(45) Date of Patent: Jul. 6, 2010

(54) CHARGE-SHARING METHOD AND DEVICE FOR CLOCK SIGNAL GENERATION

(75) Inventors: Chao-Ching Hsu, Hsinchu (TW); Mu-Lin Tung, Hsinchu (TW); Chung-Shen Cheng, Hsinchu (TW)

(73) Assignee: AU Optronics Corporation, Hsinchu (TW)

( * ) Notice: Subject to any disclaimer, the term of this patent is extended or adjusted under 35 U.S.C. 154(b) by 39 days.

(21) Appl. No.: 12/315,189

(22) Filed: Nov. 28, 2008

(65) Prior Publication Data

US 2010/0134172 A1 Jun. 3, 2010

(51) Int. Cl.
*G06F 1/04* (2006.01)
(52) U.S. Cl. ............ 327/296; 327/91; 327/94; 327/390; 327/403; 341/122; 341/133
(58) Field of Classification Search ............ 327/91, 327/94, 97, 291, 293, 295–296, 378, 379, 327/403–404; 341/122–125, 133, 136; 326/83, 326/85, 86
See application file for complete search history.

(56) References Cited

U.S. PATENT DOCUMENTS

| | | | |
|---|---|---|---|
| 5,329,187 A * | 7/1994 | Crispie et al. ................. | 327/65 |
| 6,064,363 A | 5/2000 | Kwon ........................... | 345/98 |
| 6,124,840 A | 9/2000 | Kwon ........................... | 345/100 |
| 6,549,186 B1 | 4/2003 | Kwon ........................... | 345/95 |
| 6,573,881 B1 | 6/2003 | Kwon ........................... | 345/92 |
| 6,946,986 B2 * | 9/2005 | Gabillard et al. ............ | 341/150 |
| 6,999,050 B2 | 2/2006 | Hung et al. ................... | 345/87 |
| 7,327,338 B2 | 2/2008 | Moon ........................... | 345/87 |

FOREIGN PATENT DOCUMENTS

TW    1267820    12/1993

* cited by examiner

*Primary Examiner*—An T Luu
(74) *Attorney, Agent, or Firm*—Ware, Fressola, Van Der Sluys & Adolphson LLP

(57) ABSTRACT

A clock generation circuit has two output ends to provide a first clock signal and a second clock signal, in response to first and second input signals, respectively. A charge storage component is used to transfer some charge from the first output end to the charge storage component when the first clock signal is high for a period of time, and to transfer the charge from the charge storage component to the second output end when the second clock signal is low. At a different period of time in the clock cycle, the charge storage component is used to transfer some charge from the second output end to the charge storage component when the second clock signal is high for a period of time, and to transfer the charge from the charge storage component to the first output end when the first clock signal is low.

25 Claims, 17 Drawing Sheets

| Interval | CK_in | XCK_in | VCS | S1 | S2 | S3 | S4 | REMARKS |
|---|---|---|---|---|---|---|---|---|
| 1 | Low | High | High | C | C | D | D | |
| 2 | Low | High | Low | C | D | D | C | Charge sharing (XCK to STG) |
| 3 | Low | Low | Low | C | C | D | D | |
| 4 | High | Low | Low | D | C | C | D | Charge sharing (STG to CX) |
| 5 | High | Low | High | C | C | D | D | |
| 6 | High | Low | Low | D | C | C | D | Charge sharing (CK to STG) |
| 7 | Low | Low | Low | C | C | D | D | |
| 8 | Low | High | Low | C | D | D | C | Charge sharing (STG to XCX) |

C = connecting state

D = disconnecting state

FIG. 5c

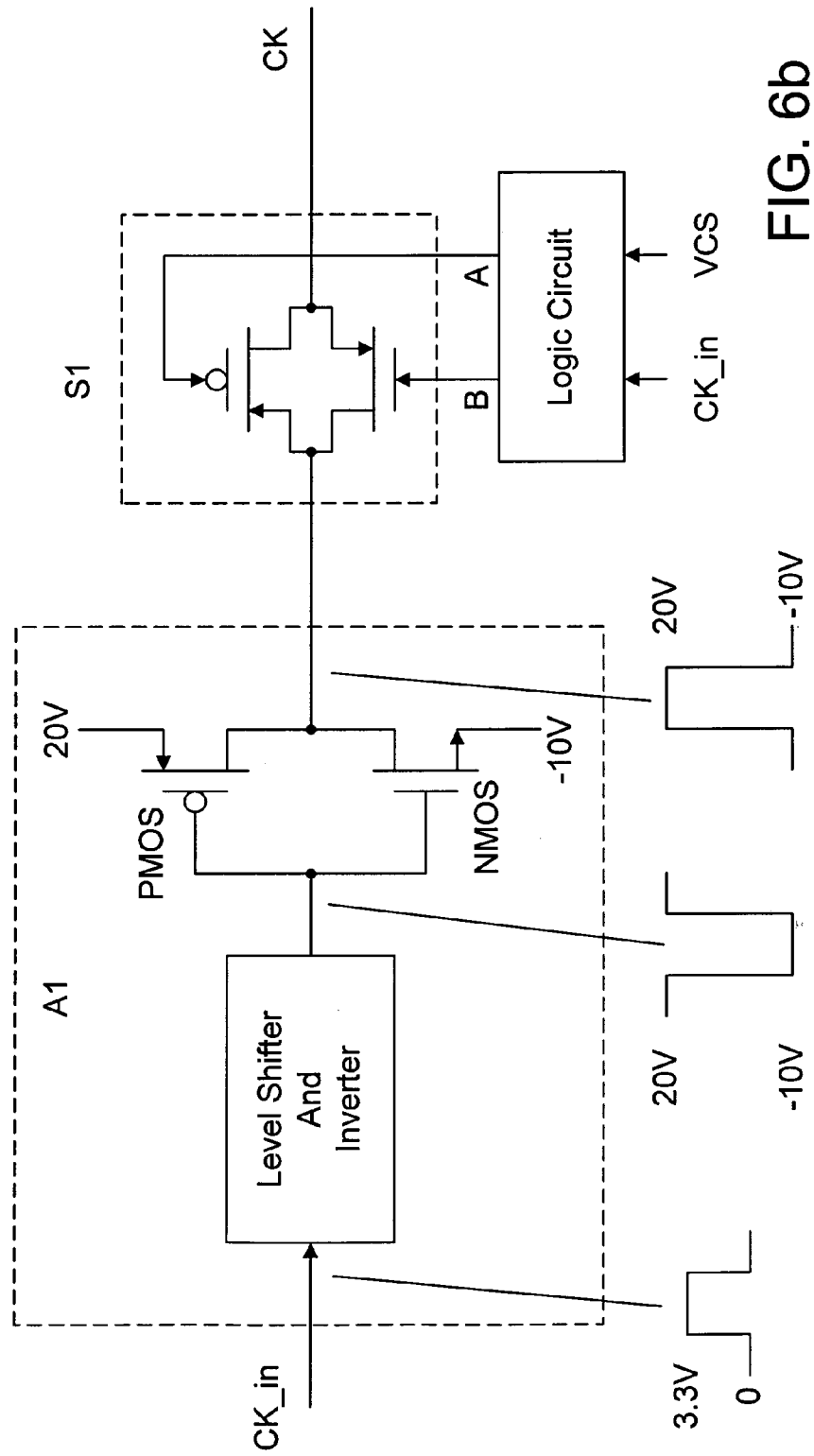
FIG. 6a
FIG. 6b

| Interval | CK_jn | VCS | A | B | PMOS | NMOS | REMARKS |
|---|---|---|---|---|---|---|---|
| 1 | Low | High | High | High | D | C | NMOS pull low (-10V) |
| 2 | Low | Low | High | High | D | C | NMOS pull low (-10V) |
| 3 | Low | Low | High | High | D | C | NMOS pull low (-10V) |
| 4 | High | Low | High | Low | D | D | Charge sharing, both MOS open |
| 5 | High | High | Low | Low | C | D | PMOS pull high (20V) |
| 6 | High | Low | High | Low | D | D | Charge sharing, both MOS open |
| 7 | Low | Low | High | High | D | C | NMOS pull low (-10V) |
| 8 | Low | Low | High | High | D | C | NMOS pull low (-10V) |

FIG. 6d

| Interval | CK_in | XCK_in | VCS1 | VCS2 | S1 | S2 | S3 | S4 | S5 | S6 | REMARKS |
|---|---|---|---|---|---|---|---|---|---|---|---|
| 1 | Low | High | High | High | C | C | D | D | D | D | |
| 2 | Low | High | Low | High | C | D | D | C | D | D | Charge sharing (XCK to STG) |
| 3 | Low | High | Low | Low | C | D | D | D | D | C | Release XCK to GND |
| 4 | Low | Low | Low | Low | C | C | D | D | D | D | |
| 5 | High | Low | Low | Low | D | C | D | D | D | D | CK pull to GND |
| 6 | High | Low | Low | High | D | C | C | D | D | D | Charge sharing (STG to CX) |
| 7 | High | Low | High | High | C | C | D | D | D | D | |
| 8 | High | Low | Low | High | D | C | D | D | C | D | Charge sharing (CK to STG) |
| 9 | High | Low | Low | Low | D | C | D | D | C | D | Release CK to GND |
| 10 | Low | Low | Low | Low | C | C | D | D | D | D | |
| 11 | Low | High | Low | Low | C | D | D | C | D | C | XCK pull to GND |
| 12 | Low | High | Low | High | C | D | D | C | D | D | Charge sharing (STG to XCX) |

FIG. 7c

CHARGE-SHARING METHOD AND DEVICE FOR CLOCK SIGNAL GENERATION

FIELD OF THE INVENTION

The present invention relates generally to a clock signal module for use in a liquid crystal display panel.

BACKGROUND OF THE INVENTION

As known in the art, a color liquid crystal display (LCD) panel 1 has a two-dimensional array of pixels 10, as shown in FIG. 1. The array of pixels 10 is organized in rows and columns and a plurality of gate lines are used to select or activate the pixels in the rows and a plurality of data lines are used to provide data to the pixels in the columns. Thus, the LCD panel 1 generally has a gate driver 300 to provide gate-line signals in the gate-lines and a data driver 200 to provide data signals to the data lines.

The gate driver 300 generally includes a plurality of shift registers connected in a cascade fashion, such that the output signal from a shift register is used as a gate-line signal to a gate line and also as a start pulse to the shift register in the next stage. As shown in FIG. 2, while the start pulse for the first stage shift register SR1 is separately provided by a ST signal, the start pulse for each of the shift registers in the following stages is provided by the shift register in the immediately preceding stage. As shown in FIG. 2, the clock input CK of the odd-numbered shift registers receives a clock signal CK and the clock input CK of the even-numbered shift registers receives a clock signal from XCK. As shown in FIG. 3, the clock signal XCK is complementary of the clock signal CK, which has a 50% duty cycle.

In a gate driver fabricated using a gate-on-array (GOA) technology, the voltage levels (Vgh=23V and Vgl=−10V) for the clock signals are boosted from a low voltage waveform by a voltage level shifter. While the shift registers are fabricated on a glass substrate, the voltage level shifter IC is implemented on a printed wire board (PWB) or printed circuit board (PCB). A flexible printed circuit (FPC) is generally used to provide connections between the glass substrate and the PWB or PCB. Because of the high peak-to-peak voltage difference in the clock signals and the large number of the shift registers connected to the clock signals, the power consumption by the parasitic capacitance is high and wasteful.

One way to reduce the power consumption by the parasitic capacitance is to use a charge sharing scheme for reducing the sudden increase or the sudden drop from one voltage level to another voltage level in the clock signals. As shown in FIG. 4a, a voltage level shifter having an input end to receive a clock signal CK_in and its complementary clock signal XCK_in (see FIG. 4b) and a control voltage VCS of about 3.3V. The voltage level shifter also has two voltage amplifiers A1 and A2 to provide the output clock signals CK and XCK. Schematically, a switch S1 is provided between the amplifier A1 and the output CK and a switch S2 is provided between the amplifier A2 and the output XCK. A third switch S3 and a resistor R are connected in series between CK and XCK. The timing for operating the switches S1, S2 and S3 is as follows:

In time periods 1, 3 and 4, S1 and S2 are closed or in the connecting state and S3 is open or in disconnecting state. Thus, the voltage levels at CK and XCK are those at the output of A1 and the output of A2, respectively.

In time periods 2 and 4, both S1 and S2 are in the disconnecting state while S3 is in the connecting state for charge-sharing between CK and XCK.

While the power consumption due to such a charge-sharing scheme can be reduced, a delay in turning on a gate line may occur.

SUMMARY OF THE INVENTION

The present invention provides a clock generation circuit comprising two output ends to provide a first clock signal and a second clock signal, in response to first and second input signals, respectively. A charge storage component is used to transfer some charge from the first output end to the charge storage component when the first clock signal is high for a period of time, and to transfer the charge from the charge storage component to the second output end when the second clock signal is low. At a different period of time in the clock cycle, the charge storage component is used to transfer some charge from the second output end to the charge storage component when the second clock signal is high for a period of time, and to transfer the charge from the charge storage component to the first output end when the first clock signal is low.

Thus, the first aspect of the present invention is a method for generating a first clock signal in a first signal path in response to a first input signal and a second clock signal in a second signal path in response to a second input signal, each of the first and second input signals comprises a first signal state (H) and a second signal state (L), each of the first and second clock signals comprises a first clock level and a second clock level. The method comprises:

performing a first electrical charge transfer from the first signal path to a charge storage component when the first input signal is in the first signal state and the second input signal is in the second signal state, causing the first clock signal to change from the first clock level to a first intermediate level;

causing the first clock signal to operate in the second clock level while the first input level remains in the second signal state;

when the first input signal is in the second signal state and the second input signal is in the first signal state:
  causing the second clock signal to change from the second clock level to a second intermediate level;
  causing the first clock signal to operate in the second clock level and the second clock signal to operate in the first clock level;

performing a second electrical charge transfer from the second signal path to the charge storage component, causing the second clock signal to change from the first clock level to a third intermediate level;

causing the second clock signal to operate in the second clock state while the second input signal remains in the first signal state;

when the first input signal is in the second signal state and the second input signal is in the first signal state, causing the first clock signal to change from the second clock level to a fourth intermediate level; and then when the first input signal is in the first signal state and the second input signal is in the second signal state, causing the first clock signal to change form the fourth intermediate level to the first clock level.

The second aspect of the present invention is a clock circuit arranged to receive a first input signal (XCK_in), a second input signal (CK_in) and a control signal (VCS) for generating a first clock signal (XCK) in a first signal path (P2) in response to the first input signal (XCK_in) and a second clock signal (CK) in a second signal path (P1) in response to the second input signal (CK_in), each of the first and second input signals comprises a first signal state (H) and a second signal state (L), each of the first and second clock signals comprises a first clock level (Vgh, 20V) and a second clock level (Vgl, −10V). The circuit comprises:

a first output end for providing the first clock signal;

a second output end for providing the second clock signal;

a first voltage level shifter for providing in the first signal path a voltage level equal to a first clock level when the first input signal is in the first signal state and providing a voltage level equal to a second clock level when the first input signal is in the second signal state;

a second voltage level shifter for providing in the second signal path a voltage level equal to the first clock level when the second input signal is in the first signal state and providing a voltage level equal to the second clock level when the second input signal is in the second signal state;

a first switching element (S2) in the first signal path, the first switching element operable in a connecting state when the first input or in a disconnecting state in response to the first input signal and the control signal;

a second switching element (S1) in the second signal path, the second switching element operable in a connecting state or in a disconnecting state in response to the second input signal and the control signal;

a third switching element (S4) for electrically connecting a charge storage component to the first signal path at a first connecting point between the first switching element and the first output end, the third switching element (S4) is operable in a connecting state and in a disconnecting state in response to the first input signal and the control signal; and a fourth switching element (S3) for electrically connecting the charge storage component to the second signal path at a second connecting point between the second switching element and the second output end, the fourth switching element (S3) is operable in a connecting state and in a disconnecting state in response to the second input signal the control signal.

The third aspect of the present invention is a clock signal generating circuit, which comprises a first output for providing a first clock signal in a first signal path;

a second output for providing a second clock signal in a second signal path, each of the first and second outputs operable in a first signal state and a second signal state;

a charge storage component operatively connected to the first and second signal paths; and a control module arranged to perform a first electrical charge transfer from the first signal path to a storage component when the first output is operated in the first state and the second output is operated in the second state;

perform a second electrical charge transfer from the storage component to the second signal path when both the first output and the second output are operated in the second state;

perform third electrical charge transfer from the second signal path to the storage component when the second output is operated in the first state and the first output is operated in the second state; and perform fourth electrical charge transfer from the storage component to the second signal path when both the first output and the second output are operated in the second state.

The present invention will become apparent upon reading the description taken in conjunction with FIGS. 5a-11.

BRIEF DESCRIPTION OF THE DRAWINGS

FIG. 5c shows the timing of charge-sharing, according to one embodiment of the present invention.

FIG. 6a shows a section of the charge sharing circuit of FIG. 5a.

FIG. 6b shows an equivalent circuit of the circuit section shown in FIG. 6a, according to one embodiment of the present invention.

FIG. 6d shows the timing of charge sharing, according to the circuit shown in FIG. 6c.

FIG. 7b shows the clock input provided to charge-sharing circuit and the resulting clock signals, according to the embodiment shown in FIG. 7a.

FIG. 7c shows the timing of charge-sharing, according to the embodiment shown in FIG. 7a.

FIG. 7d shows an equivalent circuit of the charge-sharing circuit shown in FIG. 7a.

DETAILED DESCRIPTION OF THE INVENTION

Figure 5A:
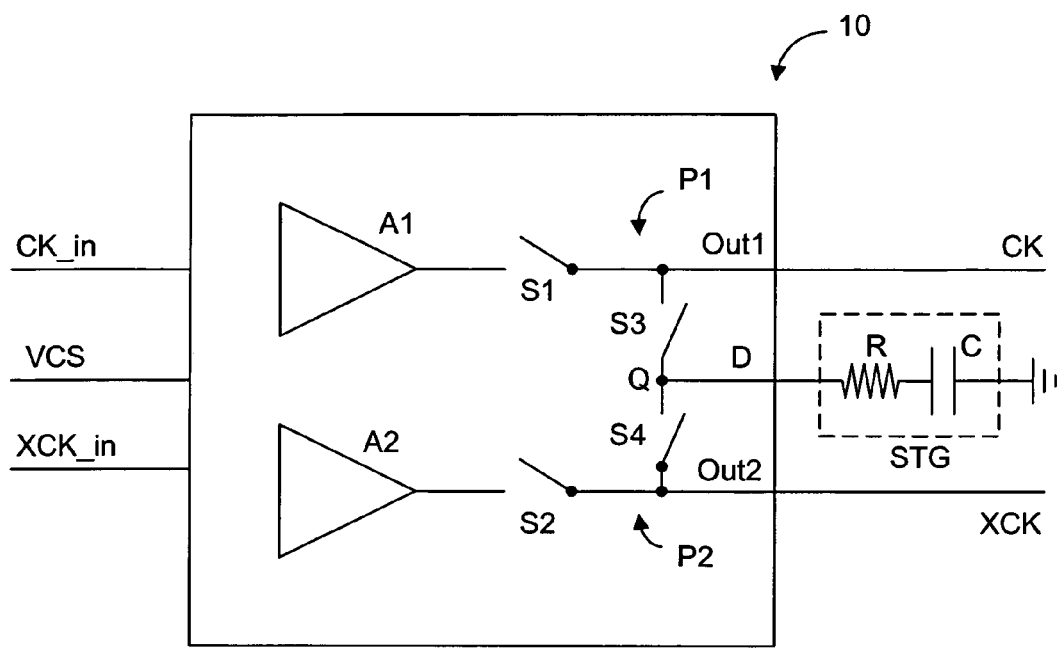
FIG. 5a is a schematic representation of a charge-sharing circuit, according to one embodiment of the present invention.

FIG. 5a shows one embodiment of the present invention. As shown in FIG. 5a, a charge-sharing circuit 10 is arranged to receive a first input signal CK_in, a second input signal XCK_in and a control voltage VCS. The charge-sharing circuit 10 has a first amplifier or voltage level lifter A1 to provide a first output signal CK at a first output Out1 via a first signal path P1 in response to the first input signal CK_in, and a second amplifier or voltage level lifter A2 to provide a second output signal XCK at a second output Out2 via a second signal path P2 in response on the second input signal XCK_in. A first switching element S1 is provided in the first signal path P1 and a second switching element S2 is provided in the second signal path P2. A third switching element S3 and a fourth switching element S4 are connected in series between the first output Out1 and the second output Out2. As shown in FIG. 5a, the first switching element S1 has two switch ends, the first switch end connected to the first voltage level lifter A1 and the second switch end connected to the first output Out1. Likewise, the second switching element S2 has two switch ends, the first switch end connected to the second voltage level lifter A2 and the second switch end connected to the second output Out2. A charge-sharing path D having a charge storage component STG is connected between a ground point and a connection point Q between S3 and S4. As shown in FIG. 5a, the storage component STG comprises a resistor R and a capacitor C connected in series.

Each of the first, second, third and fourth switching elements is operable in a first state and a second state. When a switching element is operated in the first state, it allows a signal to pass from the first switch end to the second switch end. When the switching element is operated in the second state, it electrically disconnects the first switch end from the second switch end. Thus, when the first switching element S1 is operated in the first state, it electrically connects the first output Out1 to the first voltage level lifter A1, and when the first switch S1 is operated in the second state, it electrically disconnects the first output Out1 from the first voltage source A1. Similarly, when the second switch S2 is operated in the first state, it electrically connects the second output Out2 to the second voltage level lifter A1, and when the second switching element S2 is operated in the second state, it electrically disconnects the second output Out2 from the second voltage source A2. When the third switching element S3 is operated in the first state, it electrically connects the first output Out1 to the charge-sharing path D, and when the third switching element S3 is operated in the second state, it electrically disconnects the first output Out1 from the charge-sharing path D. Likewise, when the fourth switching element S4 is operated in the first state, it electrically connects the second output Out1 to the charge-sharing path D, and when the fourth switching element S4 is operated in the second state, it electrically disconnects the second output Out2 from the charge-sharing path D.

The switching elements S1, S2, S3 and S4 are controlled in a coordinated way (see FIG. 5c) so that the voltage level at the first output Out1 and the voltage level at the second output Out2 will have intermediate values between the first voltage value of Vgh and the second voltage value of Vgl. According to various embodiments of the present invention, the intermediate values from the first output Out1 occurs at different time periods in a clock cycle than the time periods at which the intermediate value from the second output Out2 occurs.

Figure 5B:
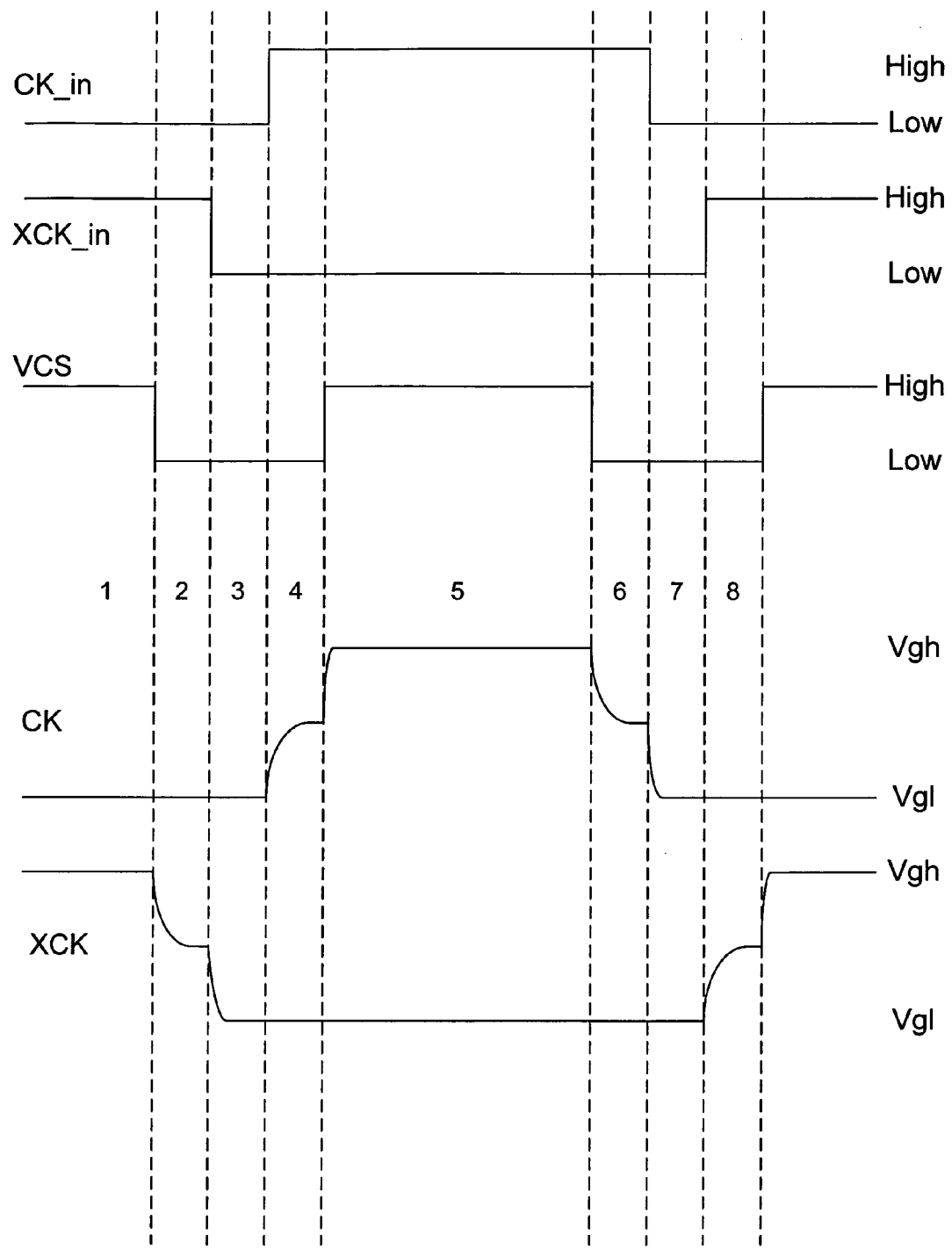
FIG. 5b shows the clock input provided to charge-sharing circuit and the resulting clock signals, according to one embodiment of the present invention.

As shown in FIG. 5b, a clock cycle can be represented by eight time periods, 1 to 8. The first input clock signal CK_in is in a first state (High) in time periods 4 to 6, and in a second state (Low) in time periods 1 to 3, 7 and 8. The second input clock signal XCK_in is in the first state in time periods 1, 2 and 8, and in the second state in time periods 3 to 7. The duty cycle of the first and second input signals is smaller than 50 percent. The control voltage VCS is in the first state in time periods 1 and 5, and in the second state in time periods 2, 3, 4, 6, 7 and 8 (see also FIG. 5c). The intermediate values in the first output signal CK are the result of charge-sharing in time periods 4 and 6. The intermediate values in the second output signal XCK are the result of charge-sharing in different time periods 2 and 8.

As illustrated in the timing table of FIG. 5c, in time period 1, CK_in is Low and CK is also Low (Vgl) because S1 is in the connecting state and S3 is disconnecting state. Likewise, XCK_in is High and XCK is also High (Vgh) because S2 is in the connecting state and S4 is in the disconnecting state. In time period 2, CK_in is Low and CK is also Low (Vgl) because S1 is in the connecting state and S3 is disconnecting state. However, S2 is in the connecting state while D4 are in the connecting state, the voltage level at the second output Out2 is reduced because of charge-sharing from XCK to the storage component STG.

In time period 3, CK_in is Low and CK is also Low (Vgl) because S1 is in the connecting state and S3 is disconnecting state. XCK_in is Low and XCK is also Low (Vgh) because S2 is in the connecting state and S4 is in the disconnecting state.

In time period 4, because S1 and S4 are in the disconnecting state and S3 is in the connecting state, the charge stored in the storage component STG is shared to the first output Out1, giving rise to the intermediate values in the voltage in CK. Both XCK_in and XCK are Low because S2 is in the connecting state.

In time period 5, both CK_in and CK are High because S1 is in the connecting state and S3 is in the disconnecting state. Both XCK_in and XCK are Low because S2 is in the connecting state and S4 is in the disconnecting state.

In time period 6, charge-sharing from CK to the storage component STG. In time period 7, CK_in is Low and CK is also Low (Vgl) because S1 is in the connecting state and S3 is disconnecting state. XCK_in is Low and XCK is also Low (Vgh) because S2 is in the connecting state and S4 is in the disconnecting state.

In time period 8, charge-sharing from the storage component STG to XCK.

Figure 6C:
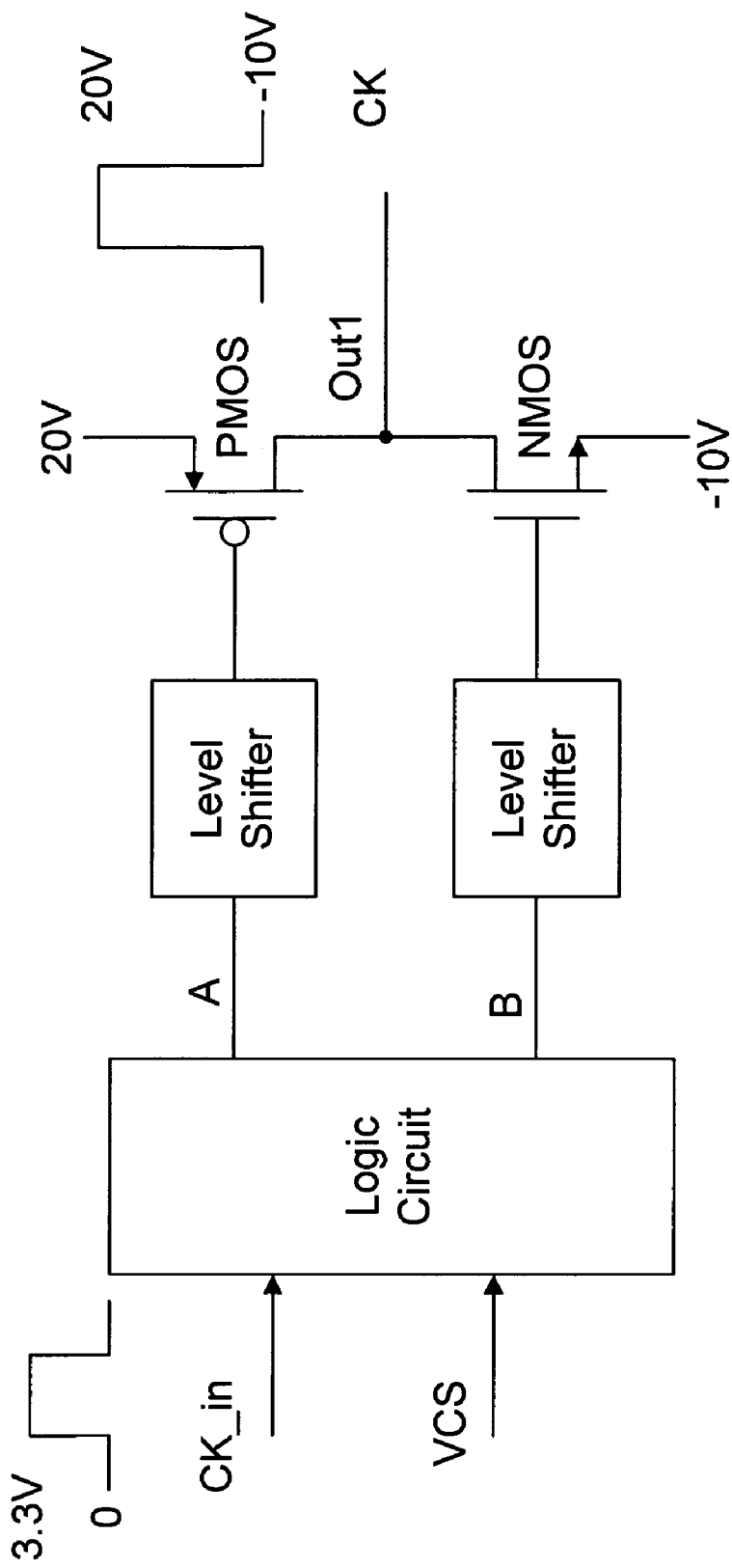
FIG. 6c shows another equivalent circuit, according to another embodiment of the present invention.

It should be noted that the control voltage VCS is used in a logic circuit as shown in FIGS. 6b and 6c. FIGS. 6b and 6c are different equivalent circuits of the circuit component as shown in FIG. 6a. FIG. 6a shows the first signal path P1 of the charge-sharing circuit of FIG. 5a. In FIG. 6c, the voltage levels A and B from the outputs of the logic circuit are determined by the following logic:

A=nCK_in OR (CK_in AND nVCS);
B=nCK_in;
n=negated.

The voltage levels A and B determine the voltage level at the first output Out 1. For example, when CK_in is Low and VCS is High, nCK_in is High and nVCS is Low. (CK_in AND nVCS) is Low. Thus, A is High and B is High. Accordingly, PMOS is in the non-conducting state while the NMOS is in the conducting state, and Out1 is Low (Vgl,−10V), as show in time period 1 of the timing table of FIG. 6d.

In time periods 2, 3, 7 and 8, both CK_in and VCS are Low. Both nCK_in and nVCS are High. (CK_in AND nVCS) is Low. Thus, A is High and B is High. As in time period 1, Out1 is Low.

In time periods 4 and 6, CK_in is High and VCS is Low, nCK_in is Low and nVCS is High. (CK_in AND nVCS) is High. Thus, A is High and B is Low. Accordingly, in time periods 4 and 6, both PMOS and NMOS are in the non-conducting state—equivalent to S1 being in the disconnecting state (FIGS. 5a and 6a). Charge-sharing occurs between the first output Out1 and the storage component STG (see FIG. 5a).

In time period 5, both CK_in and VCS are High. Both nCK_in and nVCS are Low. (CK_in AND nVCS) is Low. Thus, A is High and B is Low. Accordingly, NMOS is in the non-conducting state and PMOS is in the conducting state. Out1 is High or equal to Vgh, 20V.

In FIG. 6c, the level shifters are used to shift the input voltages from (0, 3.3V) to (−10V, 20V), for example.

The logic circuit can be used in a different way. For example, it can be used to control a transmission gate, as shown in FIG. 6b. The transmission gate is equivalent to the first switching element S1 in the charge-sharing circuit 10 of FIG. 5a. The voltage level shifter A1 (see FIGS. 5a and 6a) comprises a level shifter/inverter circuit and another inverter (PMOS+NMOS) as shown in FIG. 6b.

Figure 7A:
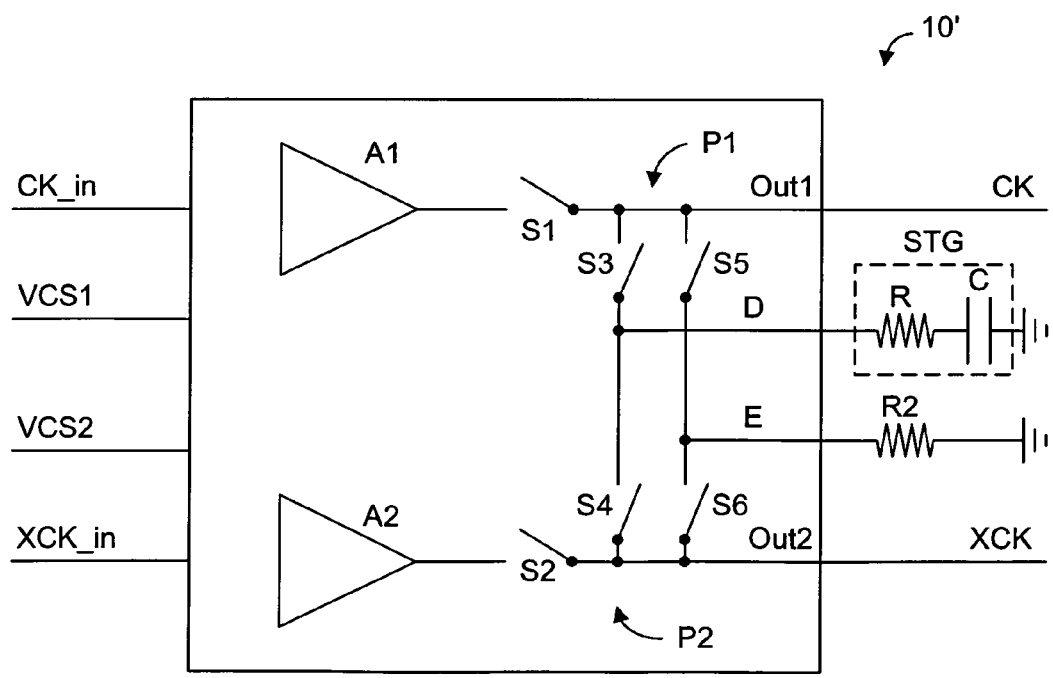
FIG. 7a is a schematic representation of a charge-sharing circuit, according to another embodiment of the present invention.

A different embodiment of the present invention is shown in FIG. 7a. In addition to the switching elements S3 and S4, two more switching elements S5 and S6 are also used to change the voltage levels at the first and second outputs Out1, Out2 in the charge-sharing circuit 10'. The switching elements S3 and S4 are used for charge-sharing between the storage component STG and the first output Out1 and between the storage component and the second output Out2 via the charge-sharing path D. As shown in FIG. 7a, a charge releasing path E having a resistor R2 is connected between a ground point and a connection point between S5 and S6. Furthermore, the charge-sharing circuit 10' is arranged to receive a first input signal CK_in, a second input signal XCK_in, a first control voltage VCS1 and a second control voltage VCS2.

Figure 7B:
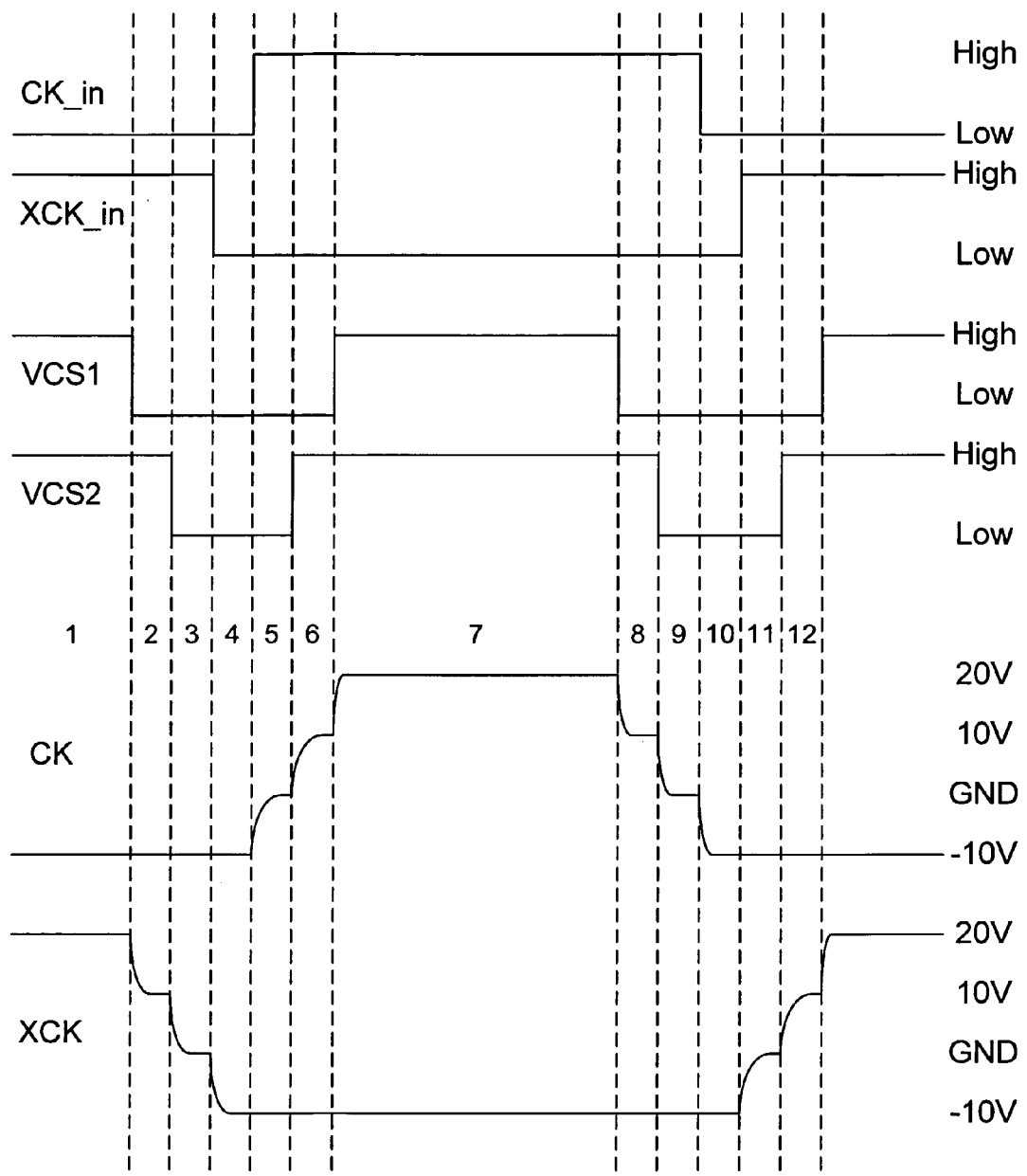
Figure 7D:
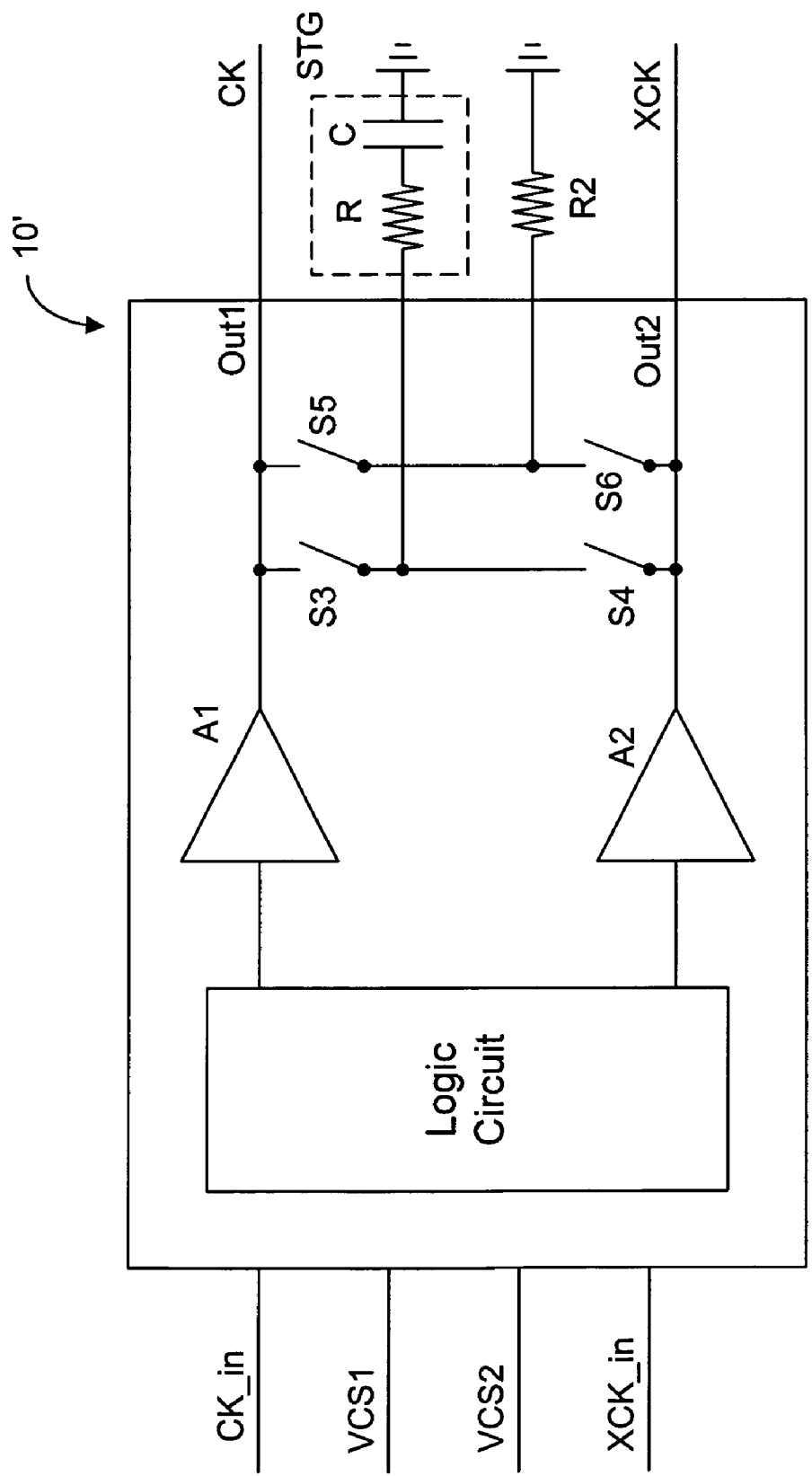

The relationship between the input clock signals CK_in, XCK_in, the control voltages VCS1, VCS2, and the output clock signals CK, XCS is shown in FIG. 7b. A corresponding timing table is shown in FIG. 7c.

In time periods 1, 4, 7 and 10 the voltage, S3, S4, S5 and S6 are in the disconnecting state while S1 and S2 are in the connecting state. The output levels at Out1 and Out2 are the same as those from the voltage level shifters A1 and A2, respectively.

In time period 2, S2, S3 and S6 are in the disconnecting state and S4 is in the connecting state. The voltage level at Out2 is reduced because charge-sharing occurs from Out2 to the storage component STG.

In time period 3, S2, S4 and S5 are in the disconnecting state and S6 is in the connecting state. The existing voltage level at Out2 is reduced to 0V due to the release of charge to the ground through the resistor R2

In time period 5, S1, S3 and S6 are in the disconnecting state and S5 is in the connecting state. The existing voltage level at Out1 is pulled to 0V due to the release of negative charge to the ground through the resistor R2.

In time period 6, S1, S4 and S5 are in the disconnecting state and S3 is in the connecting state, allowing the charge in the storage component STG obtained in time period 2 to be shared to the output Out1.

Time periods 8, 9, 11 and 12 are similar to time periods 2, 3, 5 and 6, except for the signal outputs being different.

Figure 9:
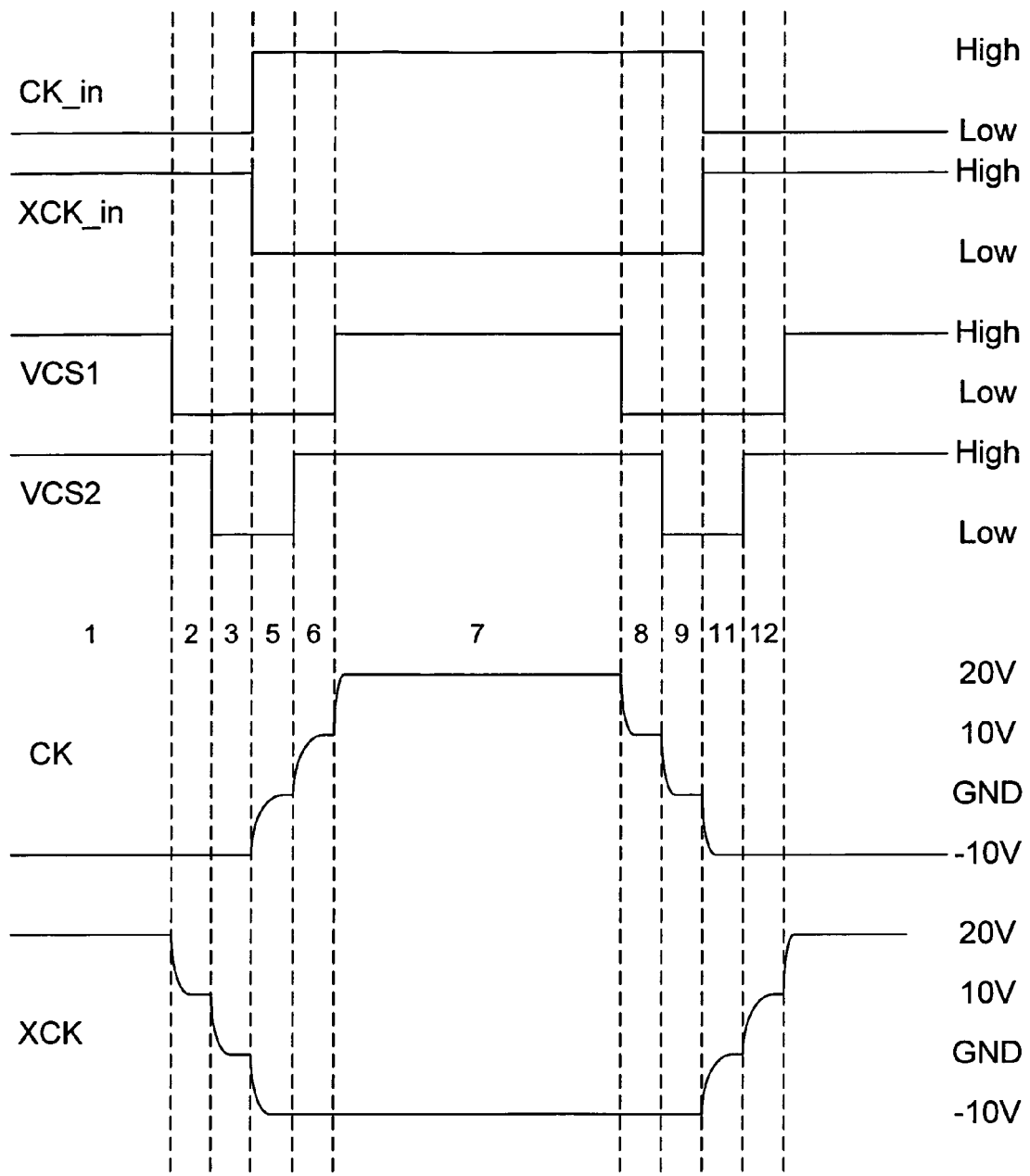
FIG. 9 shows the clock input provided to charge-sharing circuit and the resulting clock signals, according to a different embodiment of the present invention.

It should be noted that the time periods 3 and 7 as shown in FIG. 5b can be very short or even zero, as shown in FIG. 9. Likewise, the time periods 4 and 10 as shown in FIG. 7b can be very short or even zero, as shown in FIG. 9. Thus, the duty cycle for the input clocks can be close to or equal to 50 percent.

Figure 8:
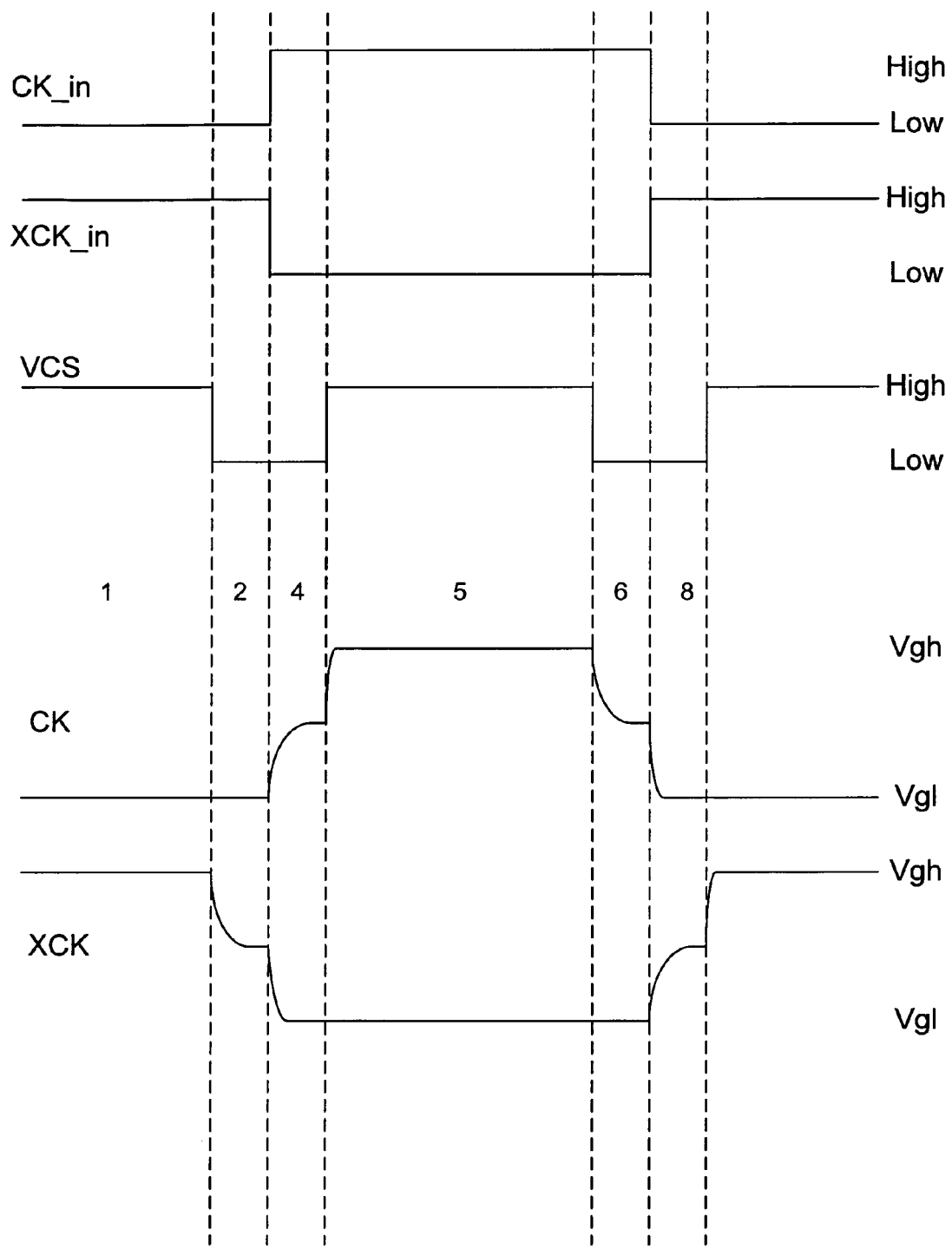
FIG. 8 shows the clock input provided to charge-sharing circuit and the resulting clock signals, according to another embodiment of the present invention.

In sum, the present invention provides a method for generating a first clock signal (XCK) in a first signal path (P2) in response to a first input signal (XCK_in) and a second clock signal (CK) in a second signal path (P1) in response to a second input signal (CK_in), each of the first and second input signals comprises a first signal state (H) and a second signal state (L), each of the first and second clock signals comprises a first clock level (Vgh, 20V) and a second clock level (Vgl, −10V). The method comprises:

performing a first electrical charge transfer from the first signal path to a charge storage component when the first input signal is in the first signal state (H) and the second input signal is in the second signal state (L), causing the first clock signal to change from the first clock level to a first intermediate level (time period 2, FIGS. 5b, 8, 9 and 7b);

causing the first clock signal to operate in the second clock level while the first input level remains in the second signal state (L) (time period 3 in FIGS. 5b, 8 and time period 4 in FIGS. 7b, 9);

when the first input signal is in the second signal state (L) and the second input signal is in the first signal state (H):
causing the second clock signal to change from the second clock level to a second intermediate level; (time period 4 in FIGS. 5b, 8 and time period 5 in FIG. 7b, 9);
causing the first clock signal to operate in the second clock level and the second clock signal to operate in the first clock level (time period 5 in FIGS. 5b, 8 and time period 7 in FIGS. 7b, 9);
performing a second electrical charge transfer from the second signal path to the charge storage component, causing the second clock signal to change from the first clock level to a third intermediate level (time period 6 in FIGS. 5b, 8 and time period 8 in FIGS. 7b, 9);
causing the second clock signal to operate in the second clock state (L) while the second input signal remains in the first signal state (H) (time period 7 in FIGS. 5b, 8 and time period 10 in FIGS. 7b, 9);

when the first input signal is in the second signal state (L) and the second input signal is in the first signal state (H), causing the first clock signal to change from the second clock level to a fourth intermediate level (time period 8 in FIGS. 5b, 8 and time period 12 in FIGS. 7b, 9); and then when the first input signal is in the first signal state and the second input signal is in the second signal state, causing the first clock signal to change form the fourth intermediate level to the first clock level.

In one embodiment of the present invention, the causing of the first clock signal to operate in the second clock level is carried out before causing the second clock signal to change from the second clock level to a second intermediate level, and the causing of the second clock signal to operate in the second clock state when the first input signal is in the second signal state (L) is carried out before causing the first clock signal to change from the second clock level to a fourth intermediate level In a different embodiment of the present invention, the causing of the first clock signal to operate in the second clock level is carried out concurrent to the causing of the second clock signal to change from the second clock level to a second intermediate level, and the causing of the second clock signal to operate in the second clock state when the first input signal is in the second signal state (L) is carried out concurrent to the causing of the first clock signal to change from the second clock level to a fourth intermediate level.

In one embodiment of the present invention, wherein when the first input signal is in the second signal state (L) and the second input signal is in the first signal state (H), performing a third charge transfer from the charge storage component to the second signal path for causing the second clock signal to change from the second clock level to a second intermediate level, and when the first input signal is in the second signal state (L) and the second input signal is in the first signal state (H), performing a fourth charge transfer from the charge storage component to the first signal path for causing the first clock signal to change from the second clock level to a fourth intermediate level.

In one embodiment of the present invention, the causing of the first clock signal to operate in the second clock level is carried out while causing the second clock signal to change from the second clock level to a second intermediate level, and wherein the causing of the second clock signal to operate in the second clock state (L) when the first input signal is in the second signal state (L) is carried out before causing the first clock signal to change from the second clock level to a fourth intermediate level.

In another embodiment of the present invention, when the first input signal is in the second signal state (L) and the second input signal is in the first signal state (H), performing a third charge transfer from the charge storage component to the second signal path for causing the second clock signal to change from the second clock level to a second intermediate level, and when the first input signal is in the second signal state (L) and the second input signal is in the first signal state (H), performing a fourth charge transfer from the charge storage component to the first signal path for causing the first clock signal to change from the second clock level to a fourth intermediate level.

In one embodiment of the present invention, the first intermediate level is substantially equal to the third intermediate level, and the second intermediate level is substantially equal to the fourth intermediate level.

In another embodiment of the present invention, the first intermediate level is substantially equal to the second intermediate level.

In one embodiment of the present invention, after performing a first electrical charge transfer from the first signal path to a storage component and before causing the first clock signal to operate in the second clock level while the first input level remains in the second signal state (L); causing the first clock signal to change from the first intermediate level to a fifth intermediate level between the first intermediate level and the second clock level while the first input signal remains in the first signal state and the second input signal remains in the second signal state (time period 3 in FIGS. 7b, 9); and after causing the second clock signal to change from the second clock level to a second intermediate level and before causing the first clock signal to operate in the second clock level and the second clock signal to operate in the first clock level; causing the second clock signal to change from a second intermediate level to a sixth intermediate level between the second intermediate level to the first clock level (H), when the first input level is in the second signal state (L) and the second input level is in the first signal state (H) (time period 6 in FIGS. 7b, 9); and after performing a second electrical charge transfer from the second signal path to the storage component and causing the second clock signal to operate in the second clock state (L), causing the second clock signal to change from the third intermediate level to a seventh intermediate level between the third intermediate level and the second clock level (L) (time period 9 in FIGS. 7b, 9); and after causing the first clock signal to change from the second clock level to a fourth intermediate level and before causing the first clock signal to change form the fourth intermediate level to the first clock level, causing the first clock signal to change from the fourth intermediate level to an eighth intermediate level between the fourth intermediate level and the first clock level (H) (time period 11 in FIGS. 7b, 9).

In one embodiment of the present invention, when the first input level is in the second signal state (L) and the second input level is in the first signal state (H), performing a third charge transfer from the charge storage component to the second signal path for causing the second clock signal to change from a second intermediate level to a sixth intermediate level between the second intermediate level to the first clock level (H); and wherein when the first input signal is in the first signal state (H) and the second input signal is in the second signal state (L), performing a fourth charge transfer from the charge storage component to the first signal path for causing the first clock signal to change from the fourth intermediate level to an eighth intermediate level between the fourth intermediate level and the first clock level (H).

In another embodiment of the present invention, while the first input signal remains in the first signal state, releasing electrical charge stored in the charge storage component to (GND) for causing the first clock signal to change from the first intermediate level to a fifth intermediate level (GND); and while the second input signal remains in the first signal stage, releasing electrical charge stored in the charge storage component to (GND) for causing the second clock signal to change from the third intermediate level to a seventh intermediate level (GND).

In one embodiment of the present invention, when the second input signal is in the first signal state (H), connecting the second signal path to (GND) through a load for causing the second clock signal to change from the second clock level to a second intermediate level (GND); (step 3) and when the first input signal is in the second signal state (L), connecting the first signal path to (GND) through the load for causing the first clock signal to change from the second clock level to a fourth intermediate level.

The present invention also provides a clock signal generating circuit. The circuit comprises: a first output for providing a first clock signal in a first signal path; a second output for providing a second clock signal in a second signal path, each of the first and second outputs operable in a first signal state and a second signal state; a charge storage component operatively connected to the first and second signal paths; and a control module. The control module is arranged to perform a first electrical charge transfer from the first signal path to a storage component when the first output is operated in the first state and the second output is operated in the second state; to perform a second electrical charge transfer from the storage component to the second signal path when both the first output and the second output are operated in the second state; to perform third electrical charge transfer from the second signal path to the storage component when the second output is operated in the first state and the first output is operated in the second state; and to perform fourth electrical charge transfer from the storage component to the second signal path when both the first output and the second output are operated in the second state.

In one embodiment of the present invention, the first output is operated in the second state between the first electrical charge transfer and the second electrical charge transfer.

In one embodiment of the present invention, the second output is operated in the second state between the third electrical charge transfer and the fourth electrical charge transfer.

In one embodiment of the present invention, each of the first and second clock signals has a first voltage level and a lower second voltage level, and when the first clock signal is at the first voltage level, the first output is operated in the first state, and when the first signal is at the second voltage level, the first output is operated in the second state, and the first clock signal is between the first and second voltage levels during the first electrical charge transfer and the fourth electrical charge transfer; and when the second clock signal is at the first voltage level, the second output is operated in the first state, and when the second signal is at the second voltage level, the second output is operated in the second state, and the first clock signal is between the first and second voltage levels during the second electrical charge transfer and the third electrical charge transfer.

According to the present invention, the second clock signal is at the first voltage level and the first clock signal is at the second voltage level between the second electrical charge transfer and the third electrical charge transfer.

The clock circuit of the present invention, is arranged to receive a first input signal (XCK_in), a second input signal (CK_in) and a control signal (VCS) for generating a first clock signal (XCK) in a first signal path (P2) in response to the first input signal (XCK_in) and a second clock signal (CK) in a second signal path (P1) in response to the second input signal (CK_in), each of the first and second input signals comprises a first signal state (H) and a second signal state (L), each of the first and second clock signals comprises a first clock level (Vgh, 20V) and a second clock level (Vgl, 10V). The circuit comprises: a first output end for providing the first clock signal; a second output end for providing the second clock signal; a first voltage level shifter for providing in the first signal path a voltage level equal to a first clock level when the first input signal is in the first signal state (H) and providing a voltage level equal to a second clock level when the first input signal is in the second signal state (H); a second voltage level shifter for providing in the second signal path a voltage level equal to the first clock level when the second input signal is in the first signal state (H) and providing a voltage level equal to the second clock level when the second input signal is in the second signal state (H); a first switching element (S2) in the first signal path, the first switching element operable in a connecting state when the first input or in a disconnecting state in response to the first input signal and the control signal; a second switching element (S1) in the second signal path, the second switching element operable in a connecting state or in a disconnecting state in response to the second input signal and the control signal; a third switching element (S4) for electrically connecting a charge storage component to the first signal path at a first connecting point between the first switching element and the first output end, the third switching element (S4) is operable in a connecting state and in a disconnecting state in response to the first input signal and the control signal; and a fourth switching element (S3) for electrically connecting the charge storage component to the second signal path at a second connecting point between the second switching element and the second output end, the fourth switching element (S3) is operable in a connecting state and in a disconnecting state in response to the second input signal the control signal.

According to the present invention, the control voltage comprises a first control level (H) and a second control level (L), and the circuit further comprises a logic circuit for controlling the first, second, third and fourth switching elements such that when the first switching element (S2) is in the connecting state when the second input signal is in the first signal state (H) and the control signal is in the first control level (H), or when the first input signal in the first signal state (L) and the control signal is in the second control level (L). When the first switching element (S2) is in the disconnecting state when the second input signal is the first signal state (H) and the control signal is in the second control level (L). Furthermore, when the second switching element (S1) is in the connecting state when the first input signal is in the second signal state (L), or when the first input signal is in the first signal state (H) and the control signal is in the first control level (H), and when the second switching element (S1) is in the disconnecting state when the first input signal is in the first signal state (H) and the control signal is in the second control level (L). When the third switching element (S4) is in the connecting state when the first switching element is in the disconnecting state, and when the third switching element is in the disconnecting state when the first switching element is in the connecting state. When the fourth switching element (S3) is in the connecting state when the second switching element is in the disconnecting state, and when the fourth switching element is in the disconnecting state when the second switching element is in the connecting state.

According to the present invention, the circuit further comprises a fifth switching element (S6) electrically connecting the first signal path (P2) to a voltage level shifting path for changing voltage level on the first signal path to a different voltage level between the first clock level (H) and the second clock level (L), and a sixth switching element (S5) electrically connecting the second signal path (P1) to the voltage level shifting path for changing voltage level on the second signal path to the different voltage.

According to a different embodiment, the circuit is also arranged to receive a further control signal, the further control signal comprises a first further control level (H) and a second further control level (L). The circuit further comprises: a fifth switching element (S6) electrically connecting the first signal path (P2) to a voltage level shifting path for changing voltage level on the first signal path to a different voltage level between the first clock level (H) and the second clock level (L), and a sixth switching element (S5) electrically connecting the second signal path (P1) to the voltage level shifting path for changing voltage level on the second signal path to the different voltage, wherein the logic circuit logic is also configured to control the fifth and sixth switching elements, such that when the fifth switching element (S6) is operated in a connecting state when the first input signal is in the first signal state (H) and the further control signal is in the second further control level (L), and when the fifth switching element is in a disconnecting state when the first input signal is in the second signal state (L), or when the first input signal is in the first signal state (H) and the further control signal is in the second further control level (H). When the sixth switching element (S5) is operated in a connecting state when the second input signal is in the first signal state (H) and the further control signal is in the second further control level (L), and when the sixth switching element is operated in a disconnecting state when the second input signal is in the second signal state (L) or when the second input signal is in the first signal state (H) and the further control signal is in the second further control level (H).

In a different embodiment of the present invention, the logic circuit is further arranged for:

performing a first electrical charge transfer from the first signal path to a charge storage component when the first input signal is in the first signal state (H) and the second input signal is in the second signal state (L), causing the first clock signal to change from the first clock level to a first intermediate level;

causing the first clock signal to operate in the second clock level while the first input level remains in the second signal state (L);

when the first input signal is in the second signal state (L) and the second input signal is in the first signal state (H):
  causing the second clock signal to change from the second clock level to a second intermediate level;
  causing the first clock signal to operate in the second clock level and the second clock signal to operate in the first clock level;
  performing a second electrical charge transfer from the second signal path to the charge storage component, causing the second clock signal to change from the first clock level to a third intermediate level;

causing the second clock signal to operate in the second clock state (L) while the second input signal remains in the first signal state (H);

when the first input signal is in the second signal state (L) and the second input signal is in the first signal state (H), causing the first clock signal to change from the second clock level to a fourth intermediate level; and then when the first input signal is in the first signal state and the second input signal is in the second signal state, causing the first clock signal to change form the fourth intermediate level to the first clock level.

Figure 1:
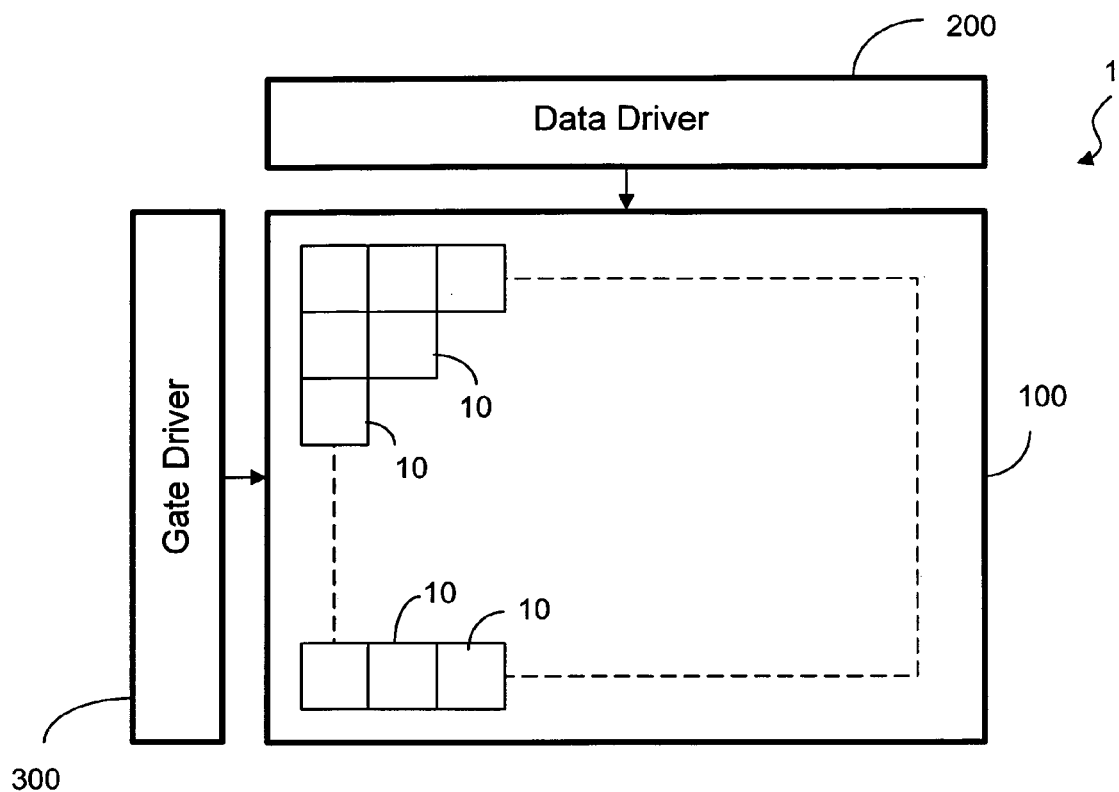
FIG. 1 is a schematic representation of the liquid crystal display.
Figure 4A:
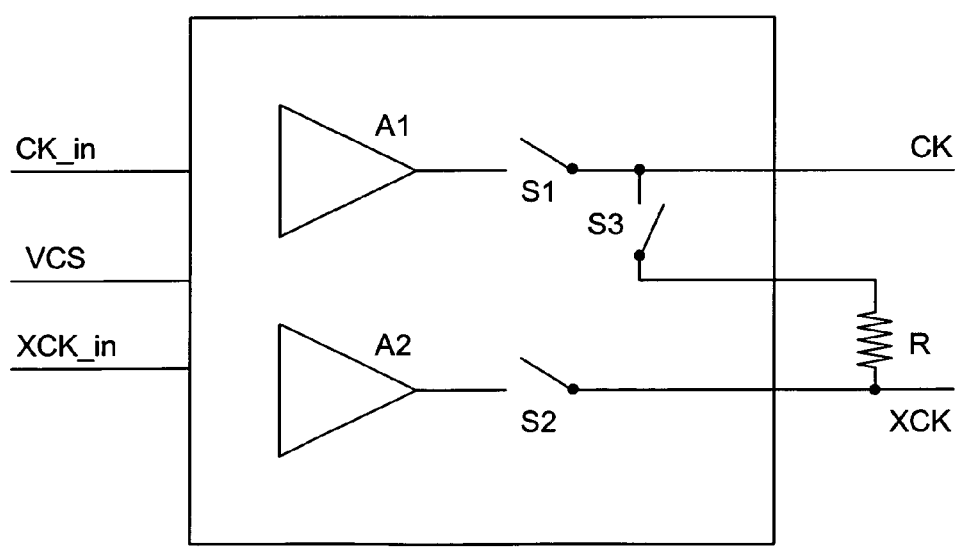
FIG. 4a is a schematic representation of a prior art charge-sharing scheme.
Figure 2:
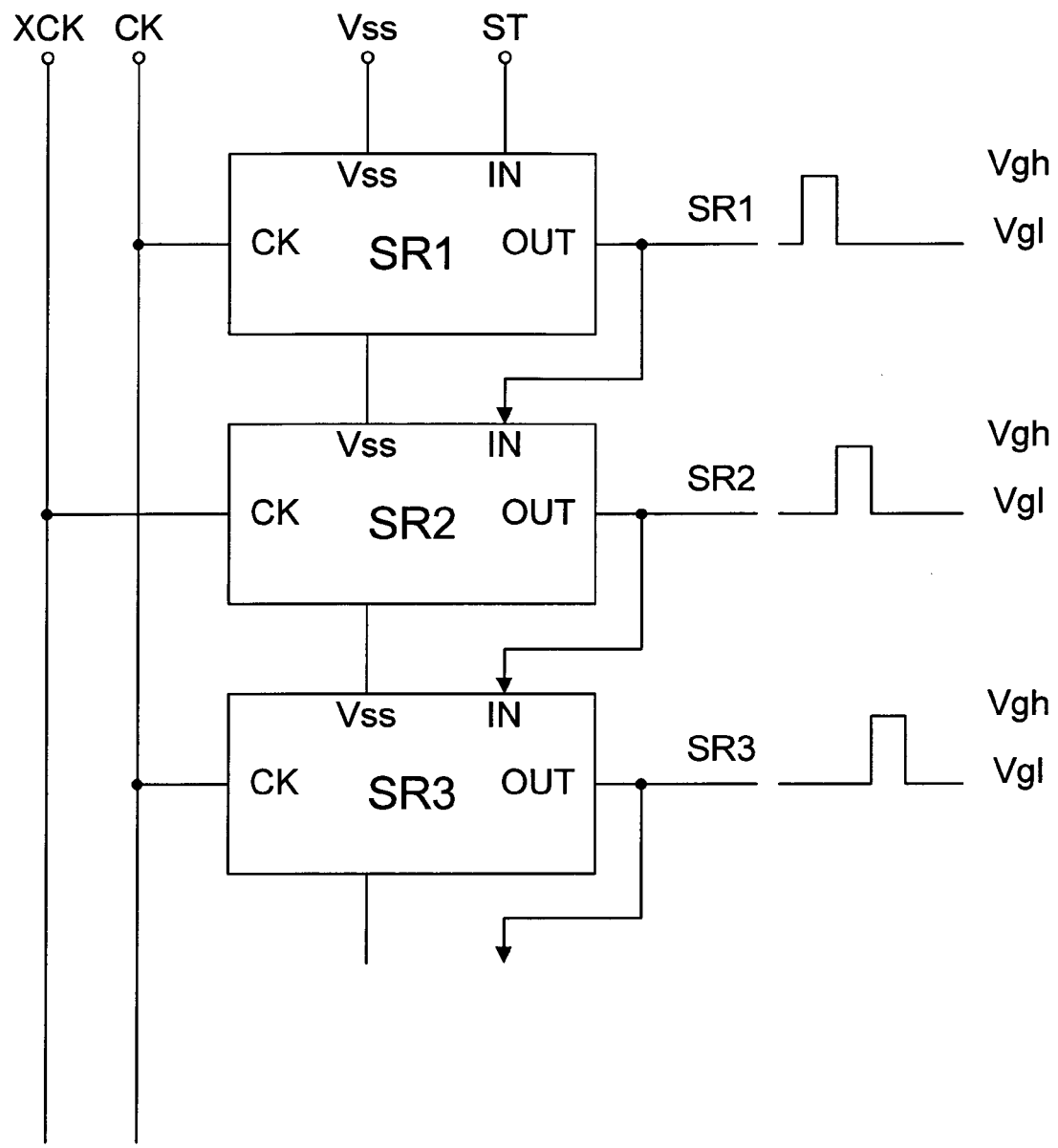
FIG. 2 shows a typical gate-on-array circuits with a plurality of shift registers.
Figure 3:
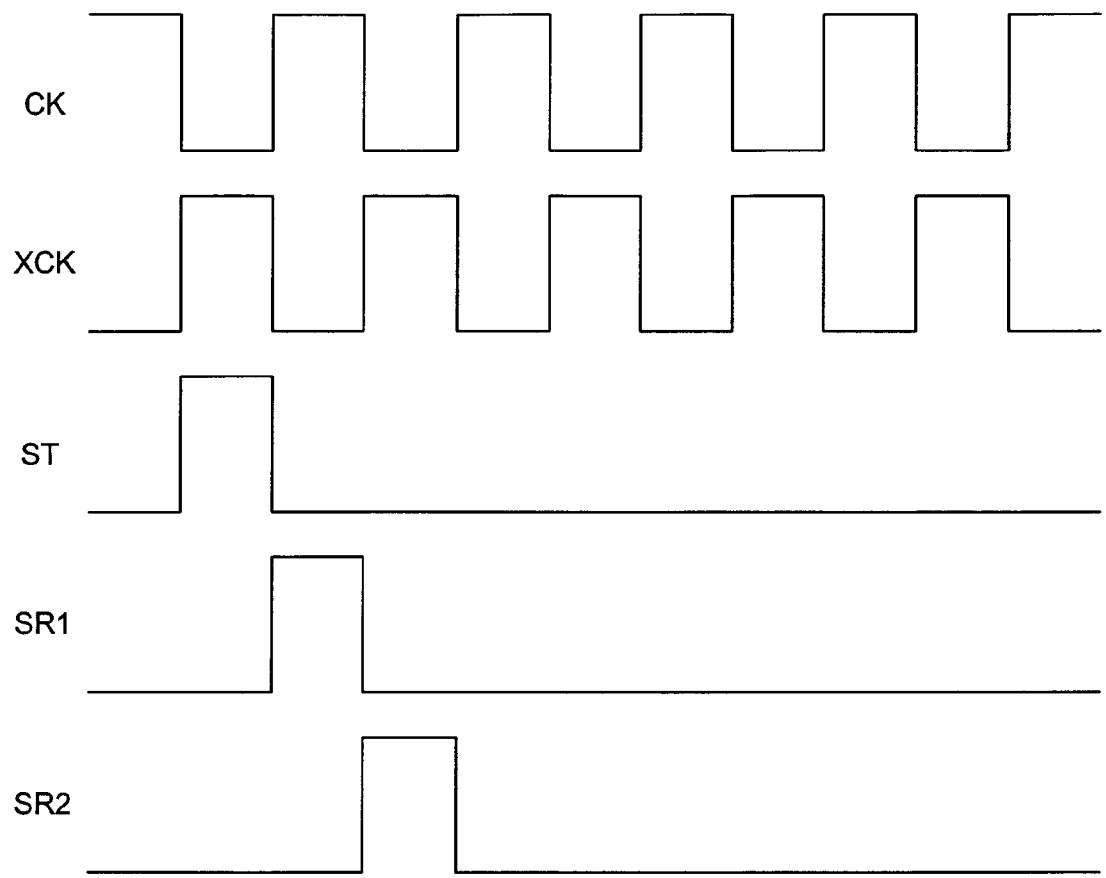
FIG. 3 is a timing chart showing the relationship between the gate line signals and the clock signals.
Figure 4B:
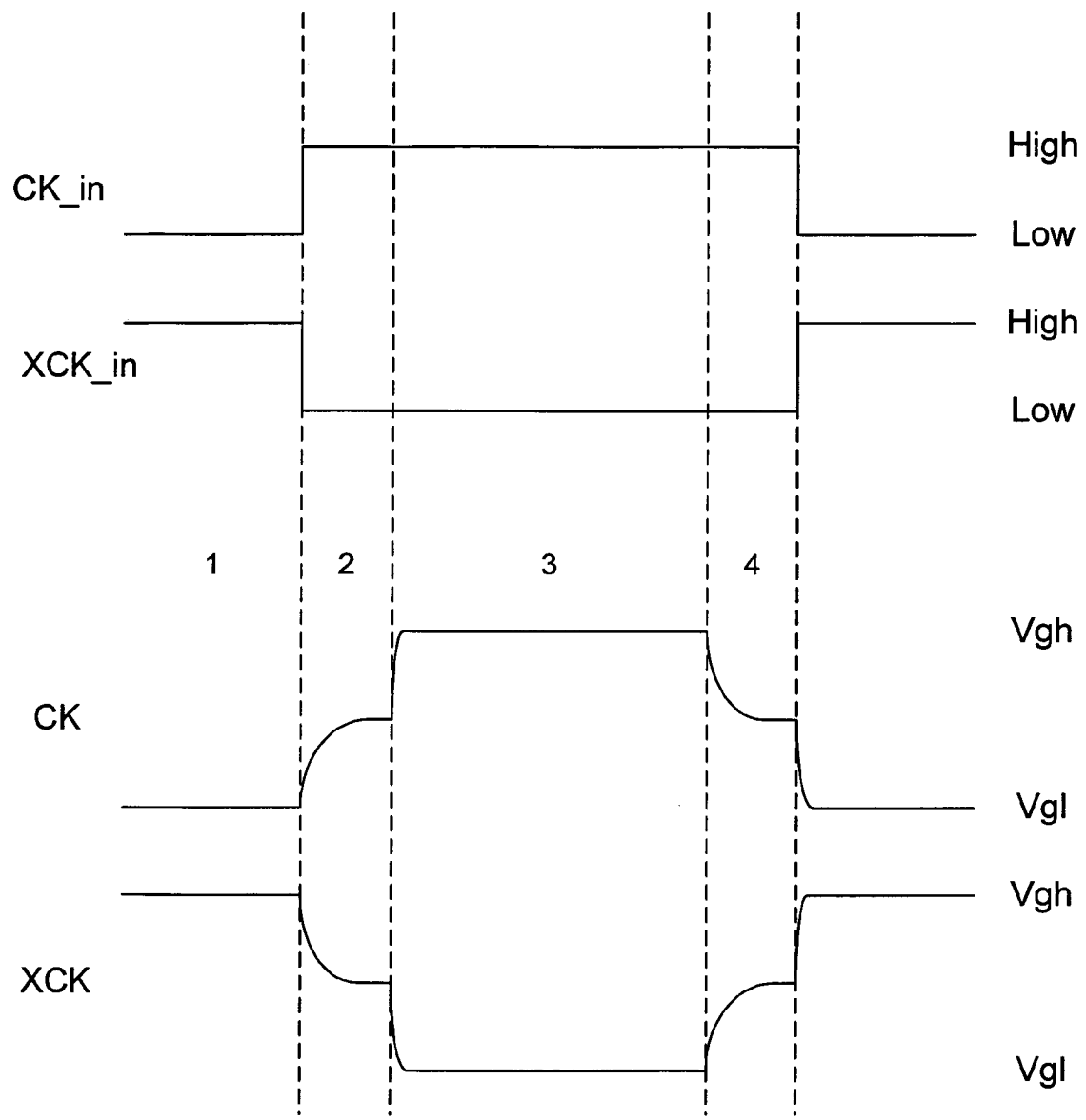
FIG. 4b shows the clock inputs provided to the prior art charge-sharing circuit and the resulting clock signals, according to the prior art charge-sharing scheme.

It should also be noted that, in the embodiments as shown in FIGS. 5a, 5b, 5c, 7a, 7b, 7c, 7d, 8 and 9, only two clock signals (CK, XCK) are provided to a plurality of shift-registers (see FIG. 2) for generating the gate line signals. In prior art, charge sharing is carried out between the two clock signals as shown in FIG. 4a. In various embodiments of the present invention, no direct charge sharing between the two clock signals. Instead, charge sharing is achieved through a charge storage device. This charge sharing scheme is feasible when the H-state of the input clock signals has no overlapping period. As shown in FIGS. 5b, 7b, 8 and 9, when one of the input clock signals (CK_in, XCK_in) is High, the other is always Low.

Figure 10:
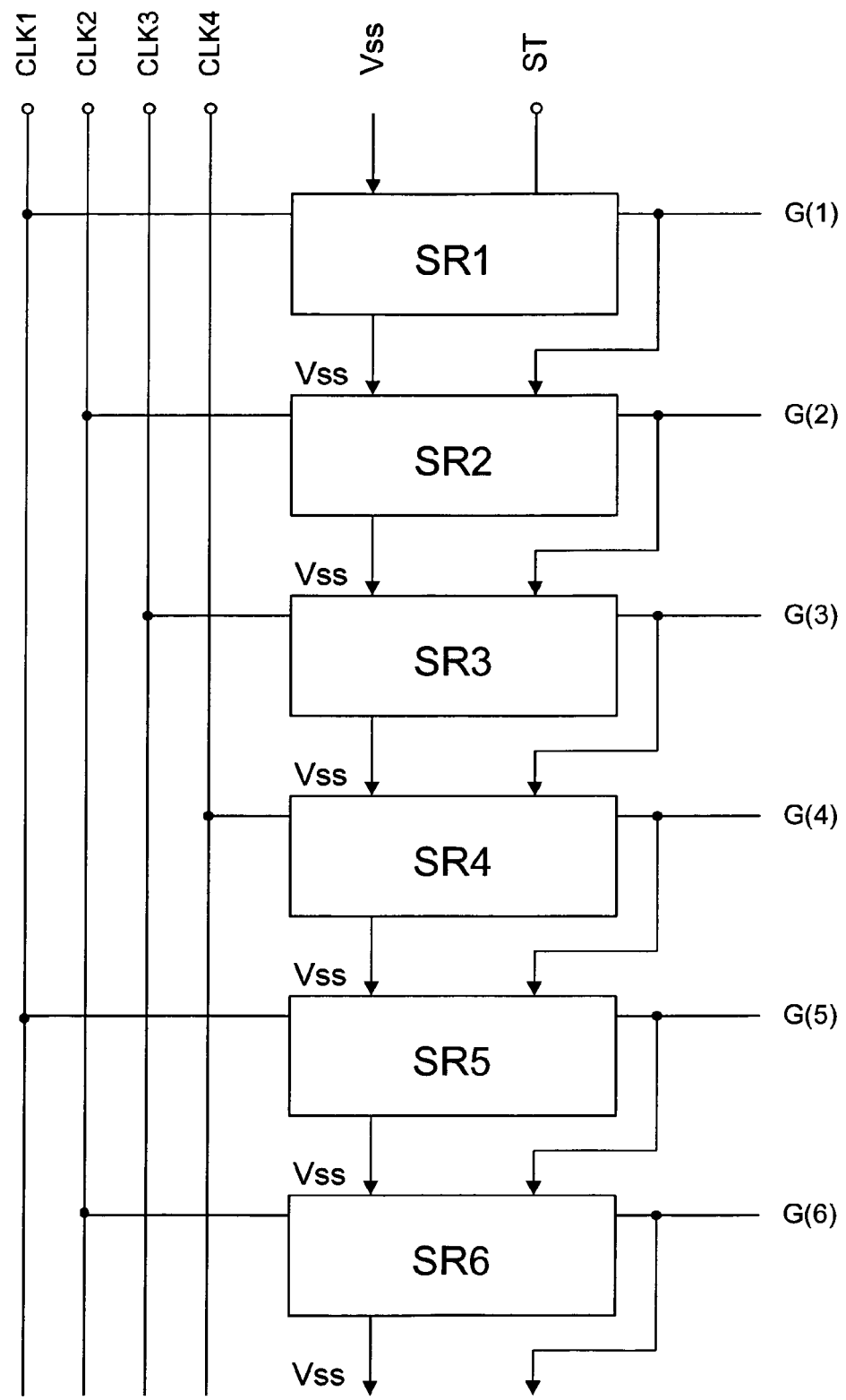
FIG. 10 shows a different arrangement of the shift registers, according to a different embodiment of the present invention.
Figure 11:
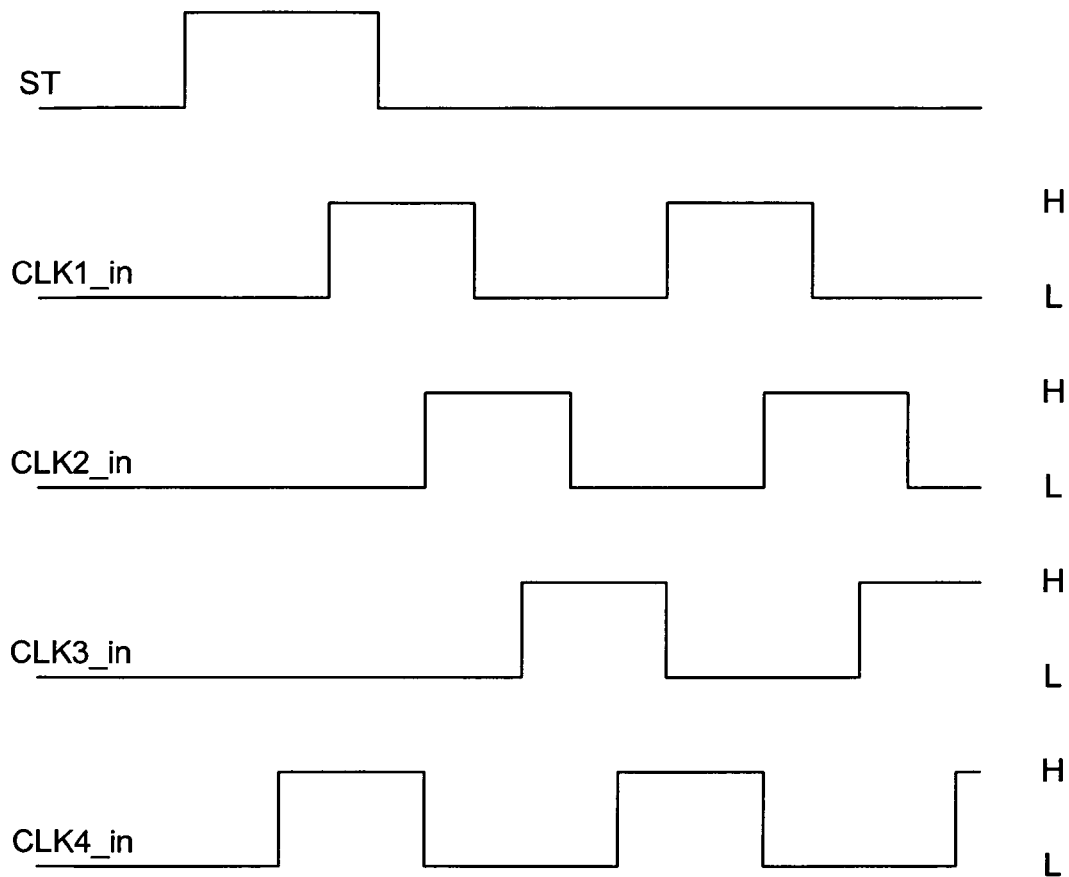
FIG. 11 shows the phase relationship when four input clock signals are used for generating the gate line signals.

It is possible that more than two clock signals are provided to a plurality of shift-registers for generating the gate line signals. For example, four clock signals (CLK1, CLK2, CLK3, CLK4) are used to generate the gate line signals (see FIG. 10). In order to carry out charge sharing through a third circuit component, such as a charge storage component, the phase of the input clock signals is arranged such that the H-state of one input clock signal has no overlapping period with the H-state of another input clock signal. As shown in FIG. 11, when the input clock signal CLK1_in is H, the input signal CLK3_in is always L. When the input clock signal CLK3_in is H, the input signal CLK1_in is always L. Similarly, when the input clock signal CLK2_in is H, the input signal CLK4_in is always L. When the input clock signal CLK4_in is H, the input signal CLK2_in is always L. As such, charge sharing can be achieved between the clock signal pair (CLK1, CLK3) by using the circuits as shown in FIGS. 5a, 6b, 6c, 7a and 7d. At the same time, charge sharing can be similarly achieved between the clock signal pair (CLK2, CLK4). With three clock signals, it is possible to carry out charge sharing between CLK1, CLK3, and then between CLK3, CLK1, and so on.

Thus, the present invention is applicable to a gate driving circuit in which two, three, four or more clock signals are provided to a series of shift-registers for generating the gate lines signals.

Although the present invention has been described with respect to one or more embodiments thereof, it will be understood by those skilled in the art that the foregoing and various other changes, omissions and deviations in the form and detail thereof may be made without departing from the scope of this invention.

What is claimed is:

1. A method for generating a first clock signal in a first signal path in response to a first input signal and a second clock signal in a second signal path in response to a second input signal, each of the first and second input signals comprises a first signal state and a second signal state, each of the first and second clock signals comprises a first clock level and a second clock level said method comprising:

performing a first electrical charge transfer from the first signal path to a charge storage component when the first input signal is in the first signal state and the second input signal is in the second signal state, causing the first clock signal to change from the first clock level to a first intermediate level;

causing the first clock signal to operate in the second clock level while the first input level remains in the second signal state;

when the first input signal is in the second signal state and the second input signal is in the first signal state:
causing the second clock signal to change from the second clock level to a second intermediate level;
causing the first clock signal to operate in the second clock level and the second clock signal to operate in the first clock level;
performing a second electrical charge transfer from the second signal path to the charge storage component, causing the second clock signal to change from the first clock level to a third intermediate level;
causing the second clock signal to operate in the second clock state while the second input signal remains in the first signal state;

when the first input signal is in the second signal state and the second input signal is in the first signal state, causing the first clock signal to change from the second clock level to a fourth intermediate level; and then when the first input signal is in the first signal state and the second input signal is in the second signal state, causing the first clock signal to change form the fourth intermediate level to the first clock level.

2. The method of claim 1, wherein
said causing of the first clock signal to operate in the second clock level is carried out before causing the second clock signal to change from the second clock level to a second intermediate level, and wherein
said causing of the second clock signal to operate in the second clock state when the first input signal is in the second signal state is carried out before causing the first clock signal to change from the second clock level to a fourth intermediate level.

3. The method of claim 2, wherein when the first input signal is in the second signal state and the second input signal is in the first signal state, performing a third charge transfer from the charge storage component to the second signal path for causing the second clock signal to change from the second clock level to a second intermediate level, and when the first input signal is in the second signal state and the second input signal is in the first signal state, performing a fourth charge transfer from the charge storage component to the first signal path for causing the first clock signal to change from the second clock level to a fourth intermediate level.

4. The method of claim 1, wherein said causing of the first clock signal to operate in the second clock level is carried out while causing the second clock signal to change from the second clock level to a second intermediate level, and wherein
said causing of the second clock signal to operate in the second clock state; when the first input signal is in the second signal state is carried out before causing the first clock signal to change from the second clock level to a fourth intermediate level.

5. The method of claim 4, wherein when the first input signal is in the second signal state and the second input signal is in the first signal state, performing a third charge transfer from the charge storage component to the second signal path for causing the second clock signal to change from the second clock level to a second intermediate level, and when the first input signal is in the second signal state and the second input signal is in the first signal state, performing a fourth charge transfer from the charge storage component to the first signal path for causing the first clock signal to change from the second clock level to a fourth intermediate level.

6. The method of claim 2, wherein the first intermediate level is substantially equal to the third intermediate level, and the second intermediate level is substantially equal to the fourth intermediate level.

7. The method of claims 6, wherein the first intermediate level is substantially equal to the second intermediate level.

8. The method of claim 4, wherein the first intermediate level is substantially equal to the third intermediate level, and the second intermediate level is substantially equal to the fourth intermediate level.

9. The method of claim 8, wherein the first intermediate level is substantially equal to the second intermediate level.

10. The method of claim 1, further comprising:
after performing a first electrical charge transfer from the first signal path to a storage component and before causing the first clock signal to operate in the second clock level while the first input level remains in the second signal state, causing the first clock signal to change from the first intermediate level to a fifth intermediate level between the first intermediate level and the second clock level while the first input signal remains in the first signal state and the second input signal remains in the second signal state;
after causing the second clock signal to change from the second clock level to a second intermediate level and before causing the first clock signal to operate in the second clock level and the second clock signal to operate in the first clock level; causing the second clock signal to change from a second intermediate level to a sixth intermediate level between the second intermediate level to the first clock level, when the first input level is in the second signal state and the second input level is in the first signal state;
after performing a second electrical charge transfer from the second signal path to the storage component and causing the second clock signal to operate in the second clock state, causing the second clock signal to change from the third intermediate level to a seventh intermediate level between the third intermediate level and the second clock level; and
after causing the first clock signal to change from the second clock level to a fourth intermediate level and before causing the first clock signal to change form the fourth intermediate level to the first clock level, causing the first clock signal to change from the fourth intermediate level to an eighth intermediate level between the fourth intermediate level and the first clock level.

11. The method of claim 10, wherein
when the first input level is in the second signal state and the second input level is in the first signal state, performing a third charge transfer from the charge storage component to the second signal path for causing the second clock signal to change from a second intermediate level to a sixth intermediate level between the second intermediate level to the first clock level; and wherein
when the first input signal is in the first signal state and the second input signal is in the second signal state, performing a fourth charge transfer from the charge storage component to the first signal path for causing the first clock signal to change from the fourth intermediate level to an eighth intermediate level between the fourth intermediate level and the first clock level.

12. The method of claim 11, wherein
while the first input signal remains in the first signal state, releasing electrical charge stored in the charge storage component to a ground for causing the first clock signal to change from the first intermediate level to a fifth intermediate level; and
while the second input signal remains in the first signal stage, releasing electrical charge stored in the charge storage component to the ground for causing the second clock signal to change from the third intermediate level to a seventh intermediate level.

13. The method of claim 12, wherein
when the second input signal is in the first signal state, connecting the second signal path to the ground through a load for causing the second clock signal to change from the second clock level to a second intermediate level; and
when the first input signal is in the second signal state, connecting the first signal path to the ground through the load for causing the first clock signal to change from the second clock level to a fourth intermediate level.

14. An electronic circuit arranged to receive a first input signal, a second input signal and a control signal for generating a first clock signal in a first signal path in response to the first input signal and a second clock signal in a second signal path in response to the second input signal, each of the first and second input signals comprises a first signal state and a second signal state, each of the first and second clock signals comprises a first clock level and a second clock level said circuit comprising:
a first output end for providing the first clock signal;
a second output end for providing the second clock signal;
a first voltage level shifter for providing in the first signal path a voltage level equal to a first clock level when the first input signal is in the first signal state and providing a voltage level equal to a second clock level when the first input signal is in the second signal state;
a second voltage level shifter for providing in the second signal path a voltage level equal to the first clock level when the second input signal is in the first signal state and providing a voltage level equal to the second clock level when the second input signal is in the second signal state;
a first switching element in the first signal path, the first switching element operable in a connecting state when the first input or in a disconnecting state in response to the first input signal and the control signal;
a second switching element in the second signal path, the second switching element operable in a connecting state or in a disconnecting state in response to the second input signal and the control signal;
a third switching element for electrically connecting a charge storage component to the first signal path at a first connecting point between the first switching element and the first output end, the third switching element is operable in a connecting state and in a disconnecting state in response to the first input signal and the control signal; and
a fourth switching element for electrically connecting the charge storage component to the second signal path at a second connecting point between the second switching element and the second output end, the fourth switching element is operable in a connecting state and in a disconnecting state in response to the second input signal the control signal.

15. The circuit of claim 14, wherein the control voltage comprises a first control level and a second control level, said circuit further comprising
a logic circuit for controlling the first, second, third and fourth switching elements such that wherein
the first switching element is
in the connecting state when the second input signal is in the first signal state and the control signal is in the first control level, or when the first input signal in the first signal state and the control signal is in the second control level, and
in the disconnecting state when the second input signal is the first signal state and the control signal is in the second control level;
the second switching element is
in the connecting state when the first input signal is in the second signal state, or when the first input signal is in the first signal state and the control signal is in the first control level, and
in the disconnecting state when the first input signal is in the first signal state and the control signal is in the second control level;
the third switching element is
in the connecting state when the first switching element is in the disconnecting state, and
in the disconnecting state when the first switching element is in the connecting state;
the fourth switching element is
in the connecting state when the second switching element is in the disconnecting state, and
in the disconnecting state when the second switching element is in the connecting state.

16. The circuit of claim 14, further comprising:
a fifth switching element electrically connecting the first signal path to a voltage level shifting path for changing voltage level on the first signal path to a different voltage level between the first clock level and the second clock level, and
a sixth switching element electrically connecting the second signal path to the voltage level shifting path for changing voltage level on the second signal path to the different voltage.

17. The circuit of claim 14, further arranged to receive a further control signal, the further control signal comprises a first further control level and a second further control level, said circuit further comprising:
a fifth switching element electrically connecting the first signal path to a voltage level shifting path for changing voltage level on the first signal path to a different voltage level between the first clock level and the second clock level, and
a sixth switching element electrically connecting the second signal path to the voltage level shifting path for changing voltage level on the second signal path to the different voltage, wherein the logic circuit logic is also configured to control the fifth and sixth switching elements, such that
the fifth switching element is operated
in a connecting state when the first input signal is in the first signal state and the further control signal is in the second further control level, and
in a disconnecting state when the first input signal is in the second signal state, or when the first input signal is in the first signal state and the further control signal is in the second further control level, and
the sixth switching element is operated
in a connecting state when the second input signal is in the first signal state and the further control signal is in the second further control level, and
in a disconnecting state when the second input signal is in the second signal state or when the second input signal is in the first signal state and the further control signal is in the second further control level.

18. The circuit of claim 15, wherein the logic circuit is further arranged for:
performing a first electrical charge transfer from the first signal path to a charge storage component when the first input signal is in the first signal state and the second input signal is in the second signal state, causing the first clock signal to change from the first clock level to a first intermediate level;
causing the first clock signal to operate in the second clock level while the first input level remains in the second signal state;
when the first input signal is in the second signal state and the second input signal is in the first signal state:
causing the second clock signal to change from the second clock level to a second intermediate level;
causing the first clock signal to operate in the second clock level and the second clock signal to operate in the first clock level;
performing a second electrical charge transfer from the second signal path to the charge storage component, causing the second clock signal to change from the first clock level to a third intermediate level;
causing the second clock signal to operate in the second clock state while the second input signal remains in the first signal state;
when the first input signal is in the second signal state and the second input signal is in the first signal state, causing the first clock signal to change from the second clock level to a fourth intermediate level; and then
when the first input signal is in the first signal state and the second input signal is in the second signal state, causing the first clock signal to change form the fourth intermediate level to the first clock level.

19. The circuit of claim 18, wherein
said causing of the first clock signal to operate in the second clock level is carried out before causing the second clock signal to change from the second clock level to a second intermediate level, and wherein
said causing of the second clock signal to operate in the second clock state; when the first input signal is in the second signal state is carried out before causing the first clock signal to change from the second clock level to a fourth intermediate level.

20. The circuit of claim 18, wherein said causing of the first clock signal to operate in the second clock level is carried out while causing the second clock signal to change from the second clock level to a second intermediate level, and wherein
said causing of the second clock signal to operate in the second clock state; when the first input signal is in the second signal state is carried out before causing the first clock signal to change from the second clock level to a fourth intermediate level.

21. A clock signal generating circuit, comprising:
a first output for providing a first clock signal in a first signal path;
a second output for providing a second clock signal in a second signal path, each of the first and second outputs operable in a first signal state and a second signal state;

a charge storage component operatively connected to the first and second signal paths; and a control module arranged to
- perform a first electrical charge transfer from the first signal path to a storage component when the first output is operated in the first state and the second output is operated in the second state;
- perform a second electrical charge transfer from the storage component to the second signal path when both the first output and the second output are operated in the second state;
- perform third electrical charge transfer from the second signal path to the storage component when the second output is operated in the first state and the first output is operated in the second state; and
- perform fourth electrical charge transfer from the storage component to the second signal path when both the first output and the second output are operated in the second state.

22. The circuit of claim 21, wherein the first output is operated in the second state between the first electrical charge transfer and the second electrical charge transfer.

23. The circuit of claim 22, wherein the second output is operated in the second state between the third electrical charge transfer and the fourth electrical charge transfer.

24. The circuit of claim 21, wherein each of the first and second clock signals has a first voltage level and a lower second voltage level, and wherein when the first clock signal is at the first voltage level, the first output is operated in the first state, and when the first signal is at the second voltage level, the first output is operated in the second state, and the first clock signal is between the first and second voltage levels during the first electrical charge transfer and the fourth electrical charge transfer; and when the second clock signal is at the first voltage level, the second output is operated in the first state, and when the second signal is at the second voltage level, the second output is operated in the second state, and the first clock signal is between the first and second voltage levels during the second electrical charge transfer and the third electrical charge transfer.

25. The circuit of claim 24, wherein the second clock signal is at the first voltage level and the first clock signal is at the second voltage level between the second electrical charge transfer and the third electrical charge transfer.

* * * * *

UNITED STATES PATENT AND TRADEMARK OFFICE
CERTIFICATE OF CORRECTION

PATENT NO. : 7,750,715 B2
APPLICATION NO. : 12/315189
DATED : July 6, 2010
INVENTOR(S) : Hsu et al.

Page 1 of 1

It is certified that error appears in the above-identified patent and that said Letters Patent is hereby corrected as shown below:

1. In Column 14, line 30, claim 1, line 37 "form" should be --from--.

2. In Column 18, line 40, claim 18, line 32 "form" should be --from--.

Signed and Sealed this
Twenty-first Day of June, 2011

David J. Kappos
*Director of the United States Patent and Trademark Office*